(12) United States Patent
Okimoto et al.

(10) Patent No.: US 12,386,116 B2
(45) Date of Patent: Aug. 12, 2025

(54) SEMICONDUCTOR OPTICAL DEVICE

(71) Applicant: Sumitomo Electric Industries, Ltd., Osaka (JP)

(72) Inventors: Takuya Okimoto, Osaka (JP); Yoshihiro Yoneda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 308 days.

(21) Appl. No.: 18/125,428

(22) Filed: Mar. 23, 2023

(65) Prior Publication Data
US 2023/0408766 A1 Dec. 21, 2023

(30) Foreign Application Priority Data

Jun. 21, 2022 (JP) .................................. 2022-099561

(51) Int. Cl.
*G02B 6/122* (2006.01)
*G02B 6/12* (2006.01)
(Continued)

(52) U.S. Cl.
CPC ....... *G02B 6/1228* (2013.01); *H10F 77/1248* (2025.01); *H10F 77/306* (2025.01);
(Continued)

(58) Field of Classification Search
CPC . G02B 6/1228; G02B 6/12004; H10F 77/306; H10F 77/413; H10F 77/206; H10F 77/1248; H10F 30/223; H10F 30/225
See application file for complete search history.

(56) References Cited

U.S. PATENT DOCUMENTS

| 6,710,378 B1 | 3/2004 | Makiuchi et al. |
| 2006/0273421 A1* | 12/2006 | Yasuoka ................. H10F 77/40 |
| | | 257/E31.128 |
| 2014/0335644 A1 | 11/2014 | Inoue et al. |

FOREIGN PATENT DOCUMENTS

| JP | 2001-127333 A | 5/2001 |
| JP | 2014-220413 A | 11/2014 |

OTHER PUBLICATIONS

T. Okimoto, et al, "106-Gb/sWaveguide AlInAs/GaInAs Avalanche Photodiode with Butt-joint CouplingStructure" Optical Fiber Communication Conference (OFC) 2022, paper W3D.2 https://doi.org/10.1364/OFC.2022.W3D.2.

* cited by examiner

*Primary Examiner* — Michael P Mooney
(74) *Attorney, Agent, or Firm* — Volpe Koenig

(57) ABSTRACT

A semiconductor optical device includes a substrate a spot-size converter, an optical detector, a core layer and a first III-V compound semiconductor layer, the core layer is disposed between the substrate and the first III-V compound semiconductor layer, the optical detector includes a light absorbing layer, a second III-V compound semiconductor layer, and an insulating film,
the light absorbing layer is disposed between the substrate and the second III-V compound semiconductor layer, the second III-V compound semiconductor layer is disposed between the light absorbing layer and the insulating film, the light absorbing layer is optically coupled to the core layer, the spot-size converter has a first end face connected to the optical detector and a second end face opposite to the first end face, and the first III-V compound semiconductor layer is connected to the second III-V compound semiconductor layer and the insulating film at the first end face.

10 Claims, 10 Drawing Sheets

(51) Int. Cl.
*H10F 77/124* (2025.01)
*H10F 77/20* (2025.01)
*H10F 77/30* (2025.01)
*H10F 77/40* (2025.01)
*H10F 30/225* (2025.01)

(52) U.S. Cl.
CPC . *H10F 77/413* (2025.01); *G02B 2006/12138* (2013.01); *H10F 30/225* (2025.01); *H10F 77/206* (2025.01)

SEMICONDUCTOR OPTICAL DEVICE

This application claims priority based on Japanese Patent Application No. 2022-099561 filed on Jun. 21, 2022, and the entire contents of the Japanese patent application are incorporated herein by reference.

TECHNICAL FIELD

The present disclosure relates to a semiconductor optical device.

BACKGROUND ART

Japanese Unexamined Patent Application Publication No. 2001-127333 discloses a semiconductor light receiving device including a substrate, an optical detector formed on the substrate, and a waveguide formed on the substrate. The waveguide makes light incident on a light-receiving layer of the optical detector.

Japanese Unexamined Patent Application Publication No. 2014-220413 discloses a semiconductor optical device including a substrate, a spot-size converter, a waveguide portion, and a photodiode unit. The spot-size converter, the waveguide portion and the photodiode unit are provided on a substrate. The waveguide portion is disposed between the spot-size converter and the photodiode unit. The spot-size converter comprises a core layer and an upper cladding layer on the core layer. The thickness of the upper cladding layer varies in the direction of the waveguide axis. The photodiode unit includes a light absorbing layer and an upper cladding layer. The light reaches the light absorbing layer from the core layer through the waveguide portion.

A semiconductor optical device including a substrate, a spot-size converter, and a photodiode unit is disclosed (T. Okimoto, et al, "106-Gb/sWaveguide AlInAs/GaInAs Avalanche Photodiode with Butt-joint CouplingStructure" Optical Fiber Communication Conference (OFC) 2022, paper W3D.2.https://doi.org/10.1364/OFC.2022.W3D.2). The spot-size converter comprises a core layer and an upper cladding layer on the core layer. The photodiode unit includes a light absorbing layer, an upper cladding layer, and a contact layer. The core layer of the spot-size converter is connected to the light absorbing layer of the photodiode unit.

SUMMARY OF INVENTION

A semiconductor optical device according to one aspect of the present disclosure includes a substrate having a main surface including a first region and a second region adjacent to the first region, a spot-size converter disposed in the first region, and an optical detector disposed in the second region. The spot-size converter includes a core layer and a first III-V compound semiconductor layer, the core layer is disposed between the substrate and the first III-V compound semiconductor layer, the optical detector includes a light absorbing layer, a second III-V compound semiconductor layer, and an insulating film, the light absorbing layer is disposed between the substrate and the second III-V compound semiconductor layer, the second III-V compound semiconductor layer is disposed between the light absorbing layer and the insulating film, the light absorbing layer is optically coupled to the core layer, the spot-size converter has a first end face connected to the optical detector and a second end face opposite to the first end face, and the first III-V compound semiconductor layer is connected to the second III-V compound semiconductor layer and the insulating film at the first end face.

DESCRIPTION OF EMBODIMENTS

Figure 1:
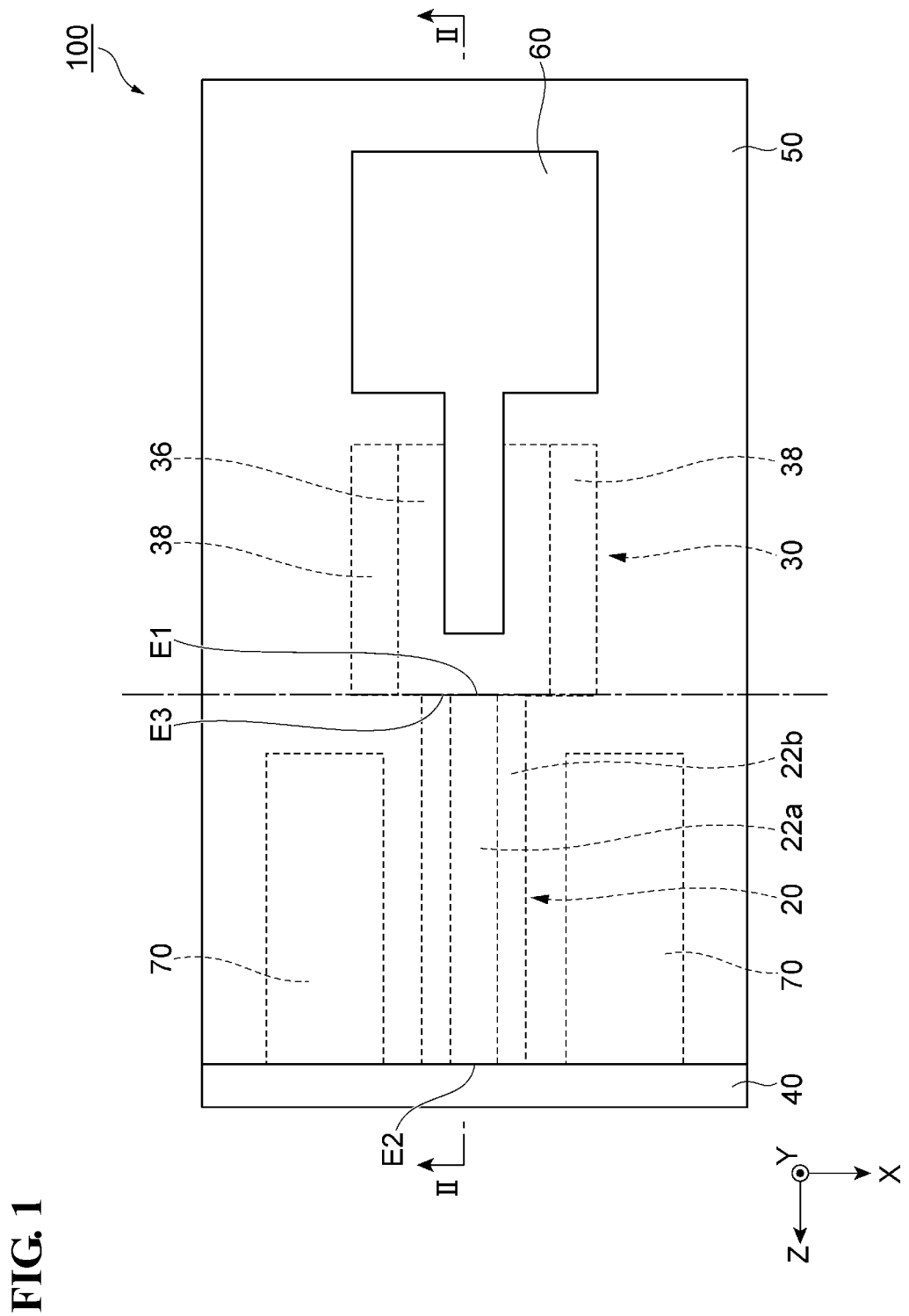
FIG. 1 is a plan view schematically showing a semiconductor optical device according to an embodiment.

When a core layer of a spot-size converter is connected to a light absorbing layer of a photodiode unit, an upper cladding layer of the spot-size converter may be thicker than an upper cladding layer of the photodiode unit due to regrowth of semiconductor. In this case, a step is formed at an emission end face of the spot-size converter connected to the photodiode unit, and the upper cladding layer of the spot-size converter is exposed. This causes scattering of light from the upper cladding layer to the outside at the emission end face of the spot-size converter connected to the photodiode unit.

The present disclosure provides a semiconductor optical device capable of suppressing scattering of light between a spot-size converter and an optical detector.

DESCRIPTION OF EMBODIMENTS OF PRESENT DISCLOSURE

First, embodiments of the present disclosure will be listed and explained.

(1) A semiconductor optical device includes a substrate having a main surface including a first region and a second region adjacent to the first region, a spot-size converter disposed in the first region, and an optical detector disposed in the second region. The spot-size converter includes a core layer and a first III-V compound semiconductor layer, the core layer is disposed between the substrate and the first III-V compound semiconductor layer, the optical detector includes a light absorbing layer, a second III-V compound semiconductor layer, and an insulating film, the light absorbing layer is disposed between the substrate and the second III-V compound semiconductor layer, the second III-V compound semiconductor layer is disposed between the light absorbing layer and the insulating film, the light absorbing layer is optically coupled to the core layer, the spot-size converter has a first end face connected to the optical detector and a second end face opposite to the first end face, and the first III-V compound semiconductor layer is connected to the second III-V compound semiconductor layer and the insulating film at the first end face.

According to the semiconductor optical device, scattering of light from the first III-V compound semiconductor layer at the first end face to the outside can be suppressed by the insulating film. Therefore, scattering of light between the spot-size converter and the optical detector can be suppressed.

(2) In the above (1), the first III-V compound semiconductor layer may have a top surface and a side surface at the second end face, the core layer may have a top surface and a side surface at the second end face, the first III-V compound semiconductor layer may cover the top surface and the side surface of the core layer, and $0.9 \leq XD/YD \leq 1.1$ may be satisfied, where YD represents a distance between the top surface of the core layer and the top surface of the first III-V compound semiconductor layer in a first direction orthogonal to the main surface, and XD represents a distance between the side surface of the core layer and the side surface of the first III-V compound semiconductor layer in a second direction orthogonal to the first direction. In this case, the polarization dependence of the spot-size converter can be reduced.

(3) In the above (1) or (2), the core layer may have a top surface and a side surface at the second end face, and $0.9 \leq XC/YC \leq 1.1$ may be satisfied, where XC represents a length of the top surface of the core layer and YC represents a length of the side surface of the core layer. In this case, the polarization dependence of the spot-size converter can be reduced.

(4) In any one of (1) to (3), the optical detector may have a third end face connected to the first end face, and a distance from the main surface to a top surface of the insulating film at the third end face may be larger than or equal to a distance from the main surface to a top surface of the first III-V compound semiconductor layer at the first end face. In this case, scattering of light from the first III-V compound semiconductor layer at the first end face to the outside can be further suppressed.

(5) In any one of (1) to (4), the semiconductor optical device may further include an electrode. The insulating film may have an opening, and the electrode may be connected to the second III-V compound semiconductor layer through the opening.

(6) In any one of (1) to (5), the insulating film may contain titanium oxide. In this case, the refractive index of the insulating film can be increased.

DETAILS OF EMBODIMENTS OF PRESENT DISCLOSURE

Hereinafter, embodiments of the present disclosure will be described in detail with reference to accompanying drawings. In the description of the drawings, the same reference numerals are used for the same or equivalent elements, and redundant description is omitted. In the drawings, an XYZ coordinates system is shown as necessary. The X-axis, the Y-axis, and the Z-axis cross each other (for example, are orthogonal to each other).

(Semiconductor Optical Device)

Figure 2:
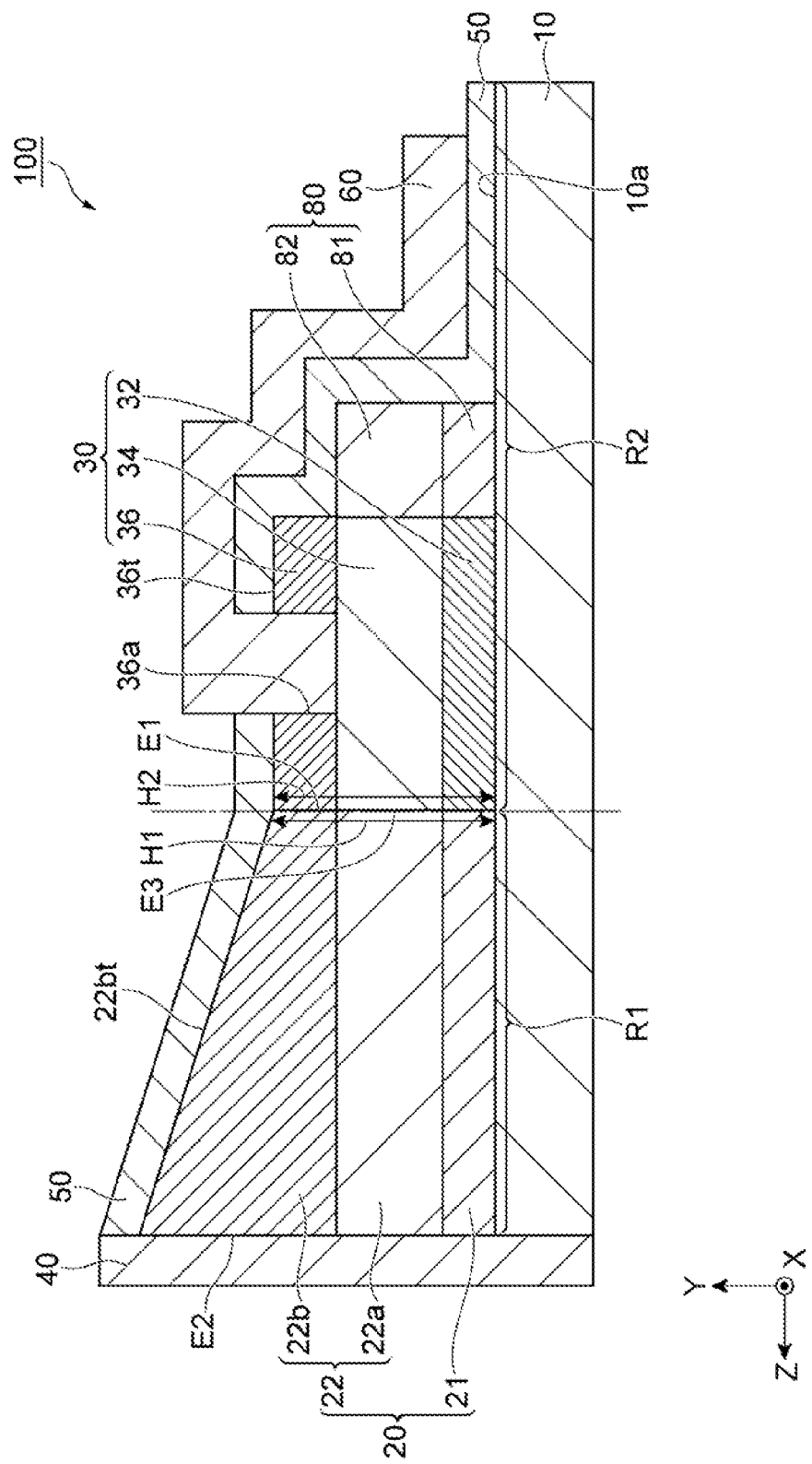
FIG. 2 is a cross-sectional view taken along line II-II of FIG. 1.

FIG. 1 is a plan view schematically showing a semiconductor optical device according to an embodiment. FIG. 2 is a cross-sectional view taken along line II-II of FIG. 1. A semiconductor optical device 100 shown in FIGS. 1 and 2 includes a substrate 10, a spot-size converter 20, and an optical detector 30.

Substrate 10 includes a main surface 10a including a first region R1 and a second region R2 adjacent to first region R1. First region R1 and second region R2 may be arranged along the Z-axis. Second region R2 may be in contact with first region R1. Substrate 10 may be a III-V compound semiconductor substrate. Substrate 10 may be an indium phosphide (InP) substrate. Substrate 10 may include a semi-insulating III-V compound semiconductor substrate and a first conductivity-type III-V compound semiconductor layer disposed on the semi-insulating III-V compound semiconductor substrate. In this case, the first conductivity-type III-V compound semiconductor layer has main surface 10a. The first conductivity type is, for example, n-type. An electrode may be connected to the first conductivity-type III-V compound semiconductor layer.

Spot-size converter 20 is disposed on first region R1. Spot-size converter 20 may have a mesa structure. Spot-size converter 20 includes a core layer 21 and a first III-V compound semiconductor layer 22. Core layer 21 is disposed between substrate 10 and first III-V compound semiconductor layer 22. Core layer 21 and first III-V compound semiconductor layer 22 may be included in the mesa structure. Core layer 21 may be an i-type gallium indium arsenide phosphide (GaInAsP) layer. Core layer 21 may have a refractive index of 3.2 to 3.4 with respect to light having a wavelength of 1.31 μm or 1.55 μm. As the refractive index of core layer 21 increases, the optical confinement effect at spot-size converter 20 increases. Therefore, when the refractive index of core layer 21 is increased, optical coupling efficiency between core layer 21 and a light absorbing layer 32 can be increased by reducing lengths of the top surface and the side surface of core layer 21.

First III-V compound semiconductor layer 22 may be a cladding layer. First III-V compound semiconductor layer 22 may include a first semiconductor layer 22a and a second semiconductor layer 22b. First semiconductor layer 22a may be an i-type InP layer. Second semiconductor layer 22b may be an i-type InP layer. First semiconductor layer 22a may have a constant thickness along the Z-axis. Second semiconductor layer 22b may have a thickness that gradually decreases from first region R1 toward second region R2 along the Z-axis. The Z axis may be parallel to the optical axis of core layer 21. Second semiconductor layer 22b may cover the side surface of first semiconductor layer 22a and the side surface of core layer 21.

Optical detector 30 is disposed on second region R2. Optical detector 30 may have a mesa structure. Optical detector 30 includes light absorbing layer 32, a second III-V compound semiconductor layer 34, and an insulating film 36. Light absorbing layer 32 is disposed between substrate 10 and second III-V compound semiconductor layer 34. Second III-V compound semiconductor layer 34 is disposed between light absorbing layer 32 and insulating film 36. Light absorbing layer 32, second III-V compound semiconductor layer 34, and insulating film 36 may be included in the mesa structure. Light absorbing layer 32 is optically coupled to core layer 21. Light absorbing layer 32 may be an i-type gallium indium arsenide (GaInAs) layer. The refractive index of core layer 21 may be adjusted to maximize the optical coupling efficiency between core layer 21 and light absorbing layer 32.

Second III-V compound semiconductor layer 34 may include a cladding layer and a contact layer. The cladding layer is disposed between core layer 21 and the contact layer. Second III-V compound semiconductor layer 34 may include a second conductivity type InP layer and a second conductivity type GaInAs layer. The second conductivity type is, for example, p-type.

Insulating film 36 may have an opening 36a. A thickness of insulating film 36 may be 0.3 μm or more, or 0.6 μm or less. Insulating film 36 may include at least one selected from the group consisting of Titanium oxide ($TiO_2$), aluminum oxide ($Al_2O_3$), silicon nitride ($Si_3N_4$), silicon oxynitride (SiON), and silicon oxide ($SiO_2$). Insulating film 36 may have a refractive index of 1.4 or more with respect to light having a wavelength of 1.31 μm or 1.55 μm.

Optical detector 30 may include an embedded region 38 covering a side surface of light absorbing layer 32 and a side surface of second III-V compound semiconductor layer 34. Embedded region 38 may include the same group III-V compound semiconductor as the group III-V compound semiconductor included in second semiconductor layer 22b.

Spot-size converter 20 includes a first end face E1 connected to optical detector 30 and a second end face E2 opposite to first end face E1. First end face E1 may be a light emitting surface. Second end face E2 may be a light incident surface. At first end face E1, first III-V compound semiconductor layer 22 is connected to second III-V compound semiconductor layer 34 and insulating film 36. First semiconductor layer 22a may be connected to second III-V compound semiconductor layer 34. Second semiconductor layer 22b may be connected to insulating film 36. At first end face E1, a step may be formed by the end face of first III-V compound semiconductor layer 22 and the end face of second III-V compound semiconductor layer 34, and insulating film 36 may be disposed on the step. At first end face E1, first III-V compound semiconductor layer 22 may contact second III-V compound semiconductor layer 34 and insulating film 36. Semiconductor optical device 100 may include an antireflection film 40 disposed at second end face E2.

Optical detector 30 may include a third end face E3 connected to first end face E1. Insulating film 36 may terminate at third end face E3. A distance H2 from main surface 10a to a top surface 36t of insulating film 36 at third end face E3 may be larger than or equal to a distance H1 from main surface 10a to a top surface 22bt of first III-V compound semiconductor layer 22 at first end face E1. At first end face E1, first III-V compound semiconductor layer 22 may be covered with second III-V compound semiconductor layer 34 and insulating film 36. The distance H2 may be smaller than the distance H1.

Semiconductor optical device 100 may include a protective film 50 covering spot-size converter 20 and optical detector 30. Semiconductor optical device 100 may further include an electrode 60. Electrode 60 may be connected to second III-V compound semiconductor layer 34 penetrating through insulating film 36 and through opening 36a of insulating film 36. Electrode 60 is disposed in opening 36a. Electrode 60 may be disposed to extend on protective film 50 along the Z-axis. Insulating film 36 and protective film 50 may be disposed between electrode 60 and second III-V compound semiconductor layer 34.

Semiconductor optical device 100 may include a plurality of semiconductor terraces 70 provided on first region R1. Spot-size converter 20 may be disposed between the plurality of semiconductor terraces 70. Each semiconductor terrace 70 may include a first layer including the same semiconductor material as the semiconductor material included in core layer 21 and a second layer including the same semiconductor material as the semiconductor material included in first semiconductor layer 22a.

Semiconductor optical device 100 may include a semiconductor stack 80 disposed in second region R2. Optical detector 30 may be disposed between semiconductor stack 80 and spot-size converter 20. Semiconductor stack 80 may include a first layer 81 including the same semiconductor material as the semiconductor material included in core layer 21 and a second layer 82 including the same semiconductor material as the semiconductor material included in first semiconductor layer 22a.

According to semiconductor optical device 100, scattering of light from first III-V compound semiconductor layer 22 at first end face E1 to the outside can be suppressed by insulating film 36. Therefore, scattering of light between spot-size converter 20 and optical detector 30 can be suppressed. Therefore, light receiving sensitivity of optical detector 30 can be improved.

When the distance H2 is larger than or equal to the distance H1, the end surface of first III-V compound semiconductor layer 22 is covered with insulating film 36. Therefore, scattering of light from first III-V compound semiconductor layer 22 at first end face E1 to the outside can be further suppressed.

When insulating film 36 contains titanium oxide, the refractive index of insulating film 36 can be increased. As a result, the difference between the refractive index of the material included in first III-V compound semiconductor layer 22 and the refractive index of insulating film 36 can be reduced. Therefore, scattering of light from first III-V compound semiconductor layer 22 at first end face E1 to the outside can be further suppressed.

Figure 3:
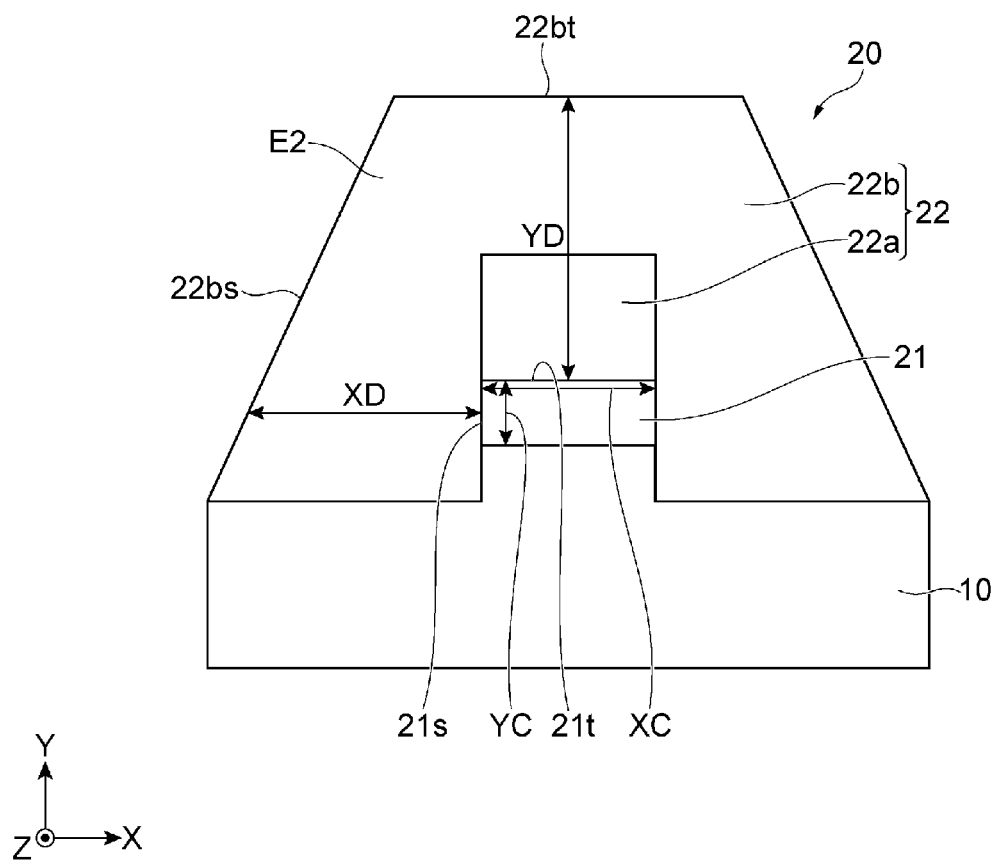
FIG. 3 shows an end view of a semiconductor optical device in accordance with one embodiment.

FIG. 3 shows an end view of a semiconductor optical device in accordance with one embodiment. In FIG. 3, antireflection film 40 and protective film 50 are omitted. In FIG. 3, second end face E2 of spot-size converter 20 is shown.

When viewed from second end surface E2, first III-V compound semiconductor layer 22 may have top surface 22bt and a side surface 22bs at second end surface E2. At second end face E2, core layer 21 may have a top surface 21t and a side surface 21s in the vicinity of second end surface E2. First III-V compound semiconductor layer 22 may cover top surface 21t and side surface 21s of core layer 21. YD represents a distance between top surface 21t of core layer 21 and top surface 22bt of first III-V compound semiconductor layer 22 in the first direction (e.g., the positive direction of the Y-axis) orthogonal to main surface 10a of substrate 10. XD represents a distance between side surface 21s of core layer 21 and side surface 22bs of first III-V compound semiconductor layer 22 in the second direction (e.g., the positive direction of the X-axis) orthogonal to the first direction. XD is measured along a straight line crossing the center of core layer 21 in the positive direction of the Y-axis. This measurement is performed by scanning electron microscope (SEM) observation of a cross-section. For example, S-8000 manufactured by Hitachi, Ltd. is used, and observation is performed under conditions of an acceleration voltage of 2.0 kV and an observation at 20,000× magnification. In this case, the following formula (1) may be satisfied.

$$0.9 \leq XD/YD \leq 1.1 \quad (1)$$

When the above formula (1) is satisfied, polarization dependence of spot-size converter 20 can be reduced.

XD may be 1 μm or more. YD may be 1.5 μm to 4.5 μm. XD may be equal to YD.

XC represents a length of top surface 21t of core layer 21. YC represents a length of side surface 21s of core layer 21. In this case, the following formula (2) may be satisfied.

$$0.9 \leq XC/YC \leq 1.1 \quad (2)$$

When the above formula (2) is satisfied, the polarization dependence of spot-size converter 20 can be reduced.

XC may be 0.1 μm to 1.0 μm. YC may be 0.2 μm to 0.6 μm. XC may be the same as YC. XC and YC may be adjusted according to the diameter of the light beam incident at second end face E2 of spot-size converter 20.

(Method of Manufacturing Semiconductor Optical Device)

Hereinafter, a method of manufacturing a semiconductor optical device according to an embodiment will be described with reference to FIGS. 4 to 13. Semiconductor optical device 100 may be manufactured as follows.

Figure 4:
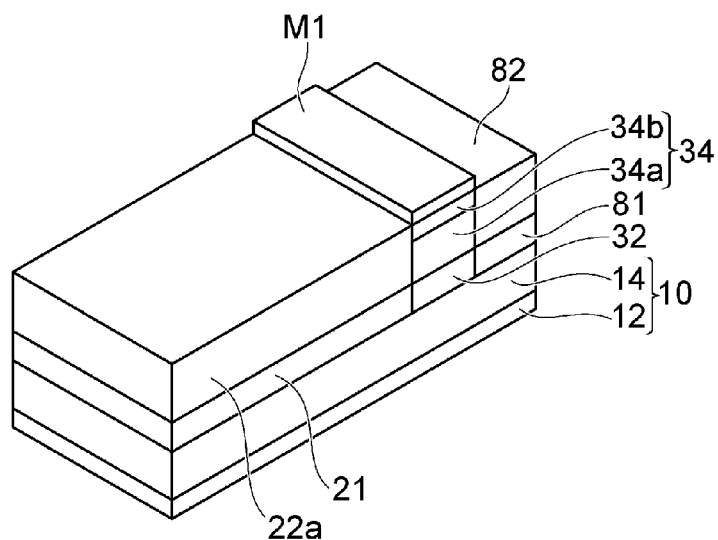
FIG. 4 is a perspective view showing one step of a method of manufacturing a semiconductor optical device according to one embodiment.

First, as shown in FIG. 4, light absorbing layer 32 and second III-V compound semiconductor layer 34 are formed in this order on substrate 10. Substrate 10 may include a semi-insulating III-V compound semiconductor substrate 12 and a first conductivity-type III-V compound semiconductor layer 14 disposed on semi-insulating III-V compound semiconductor substrate 12. The first conductivity type is, for example, n-type. Light absorbing layer 32 is formed on first conductivity-type III-V compound semiconductor layer 14. Second III-V compound semiconductor layer 34 may include a cladding layer 34a and a contact layer 34b disposed on cladding layer 34a. Cladding layer 34a is formed on light absorbing layer 32.

Next, a mask M1 is formed on second III-V compound semiconductor layer 34. Thereafter, light absorbing layer 32 and second III-V compound semiconductor layer 34 are etched. Mask M1 may be an insulating mask.

Next, using mask M1 as a mask, core layer 21 and first semiconductor layer 22a are butt-joint grown on substrate 10 in this order. A butt-joint interface is formed between first semiconductor layer 22a and second III-V compound semiconductor layer 34. At the same time, first layer 81 and second layer 82 are formed in this order.

Figure 5:
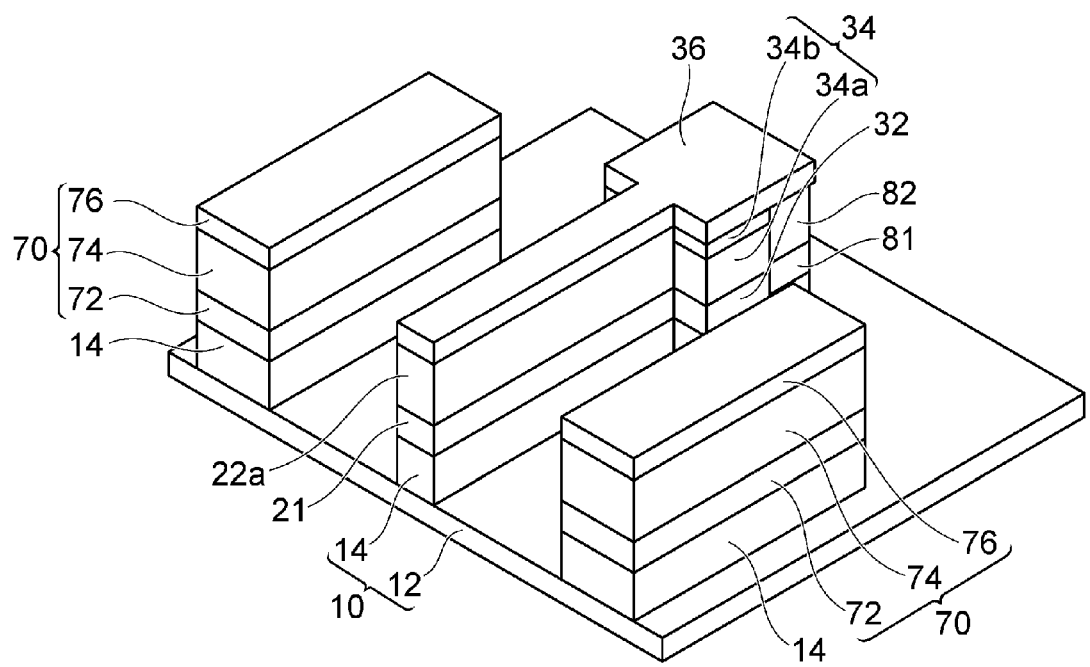
FIG. 5 is a perspective view showing one step of a method of manufacturing a semiconductor optical device according to one embodiment.

After mask M1 is removed, insulating films 36 and 76 are formed on first semiconductor layer 22a, second III-V compound semiconductor layer 34, and second layer 82. Insulating film 36 and insulating film 76 are formed by a chemical vapor deposition (CVD) method and then by photolithography and etching. Next, first semiconductor layer 22a, core layer 21, and first conductivity-type III-V compound semiconductor layer 14 are etched using insulating film 36 and insulating film 76 as a mask. Thus, as shown in FIG. 5, a mesa structure for forming spot-size converter 20 and optical detector 30, and a plurality of semiconductor terraces 70 are formed.

Figure 6:
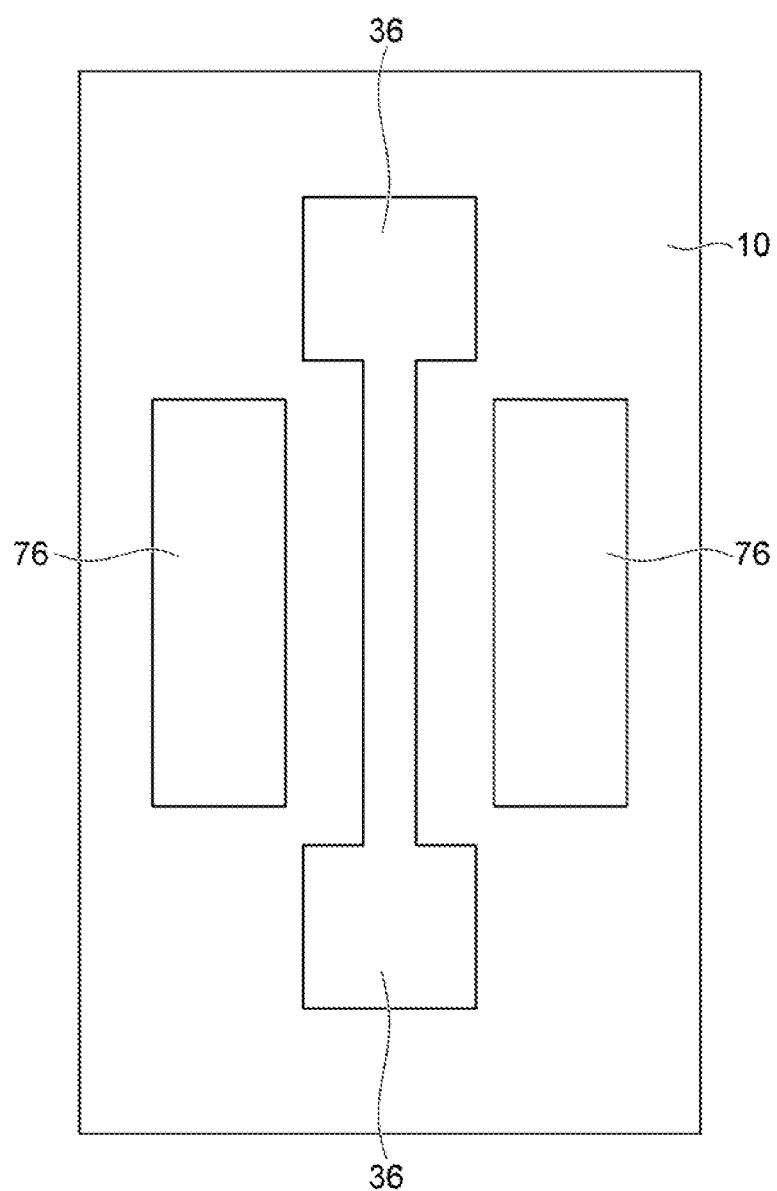
FIG. 6 is a plan view showing one step of a method of manufacturing a semiconductor optical device according to one embodiment.

Insulating film 36 and insulating film 76 have the pattern shown in FIG. 6. FIG. 5 shows a portion (half) of insulating film 36 and insulating film 76.

Figure 7:
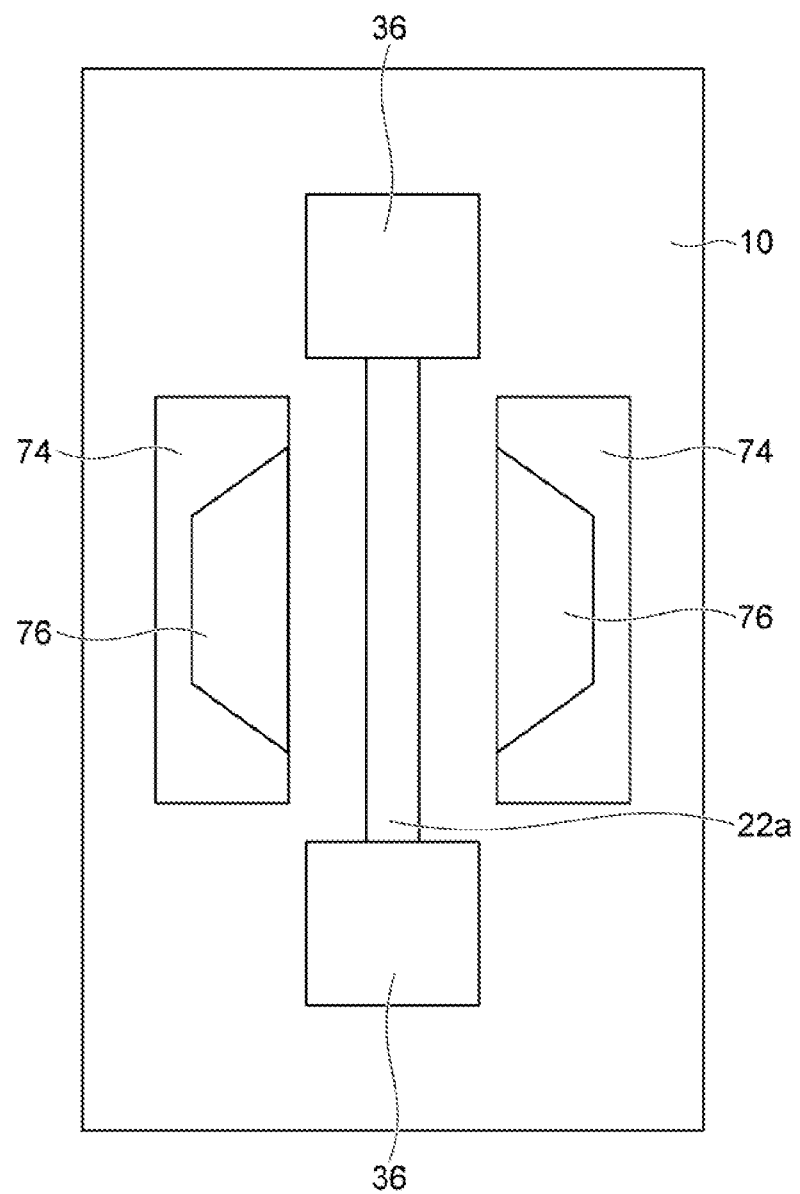
FIG. 7 is a plan view showing one step of a method of manufacturing a semiconductor optical device according to one embodiment.

Next, insulating film 36 on first semiconductor layer 22a and a part of insulating film 76 are removed by photolithography and etching. As shown in FIG. 7, insulating film 76 after etching has, for example, a trapezoidal pattern in a plan view.

Figure 8:
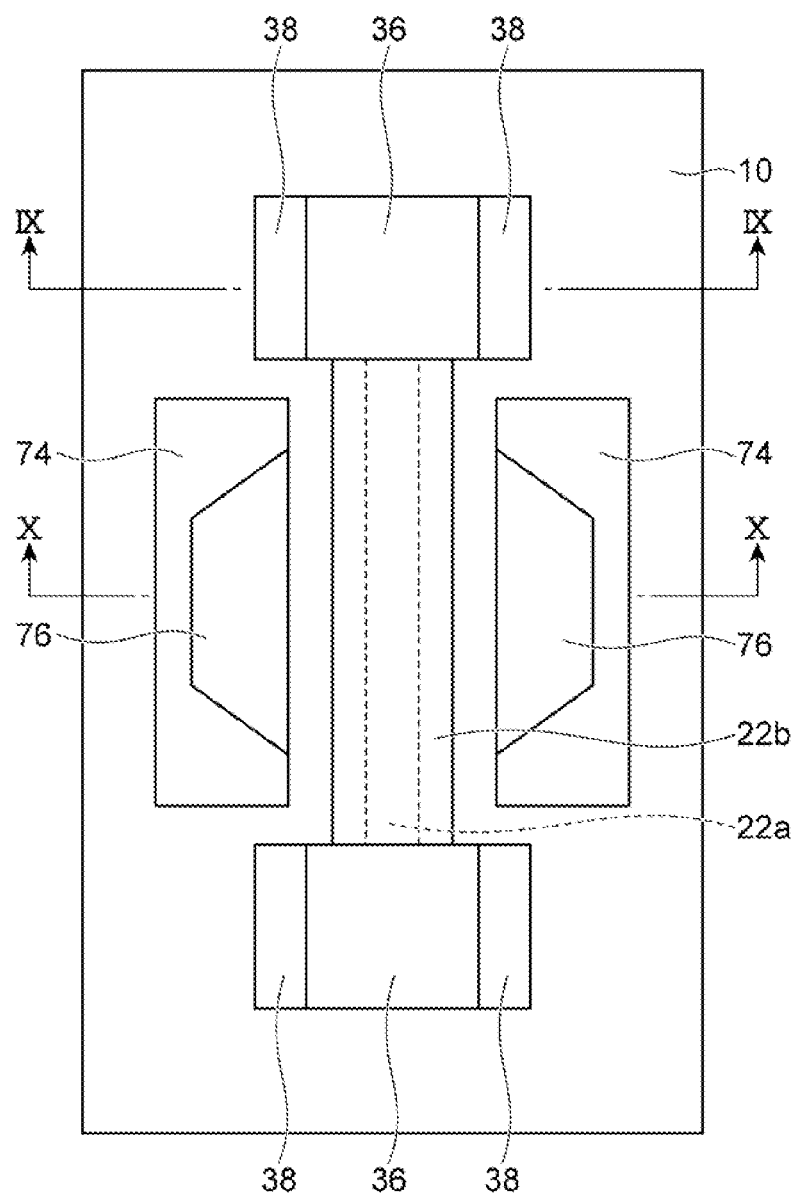
FIG. 8 is a plan view showing one step of a method of manufacturing a semiconductor optical device according to one embodiment.
Figure 9:
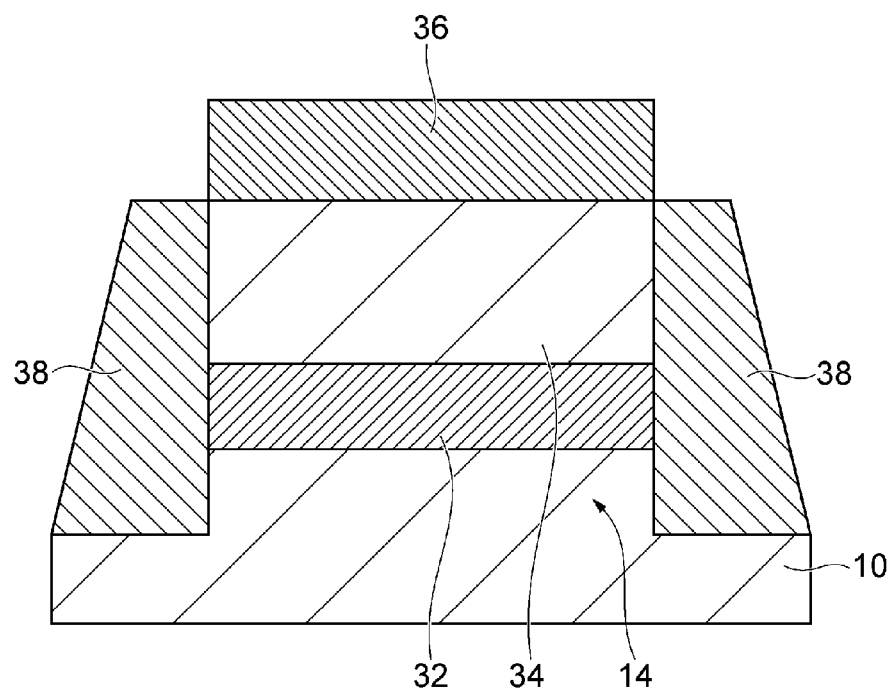
FIG. 9 is a cross-sectional view taken along line IX-IX of FIG. 8.
Figure 10:
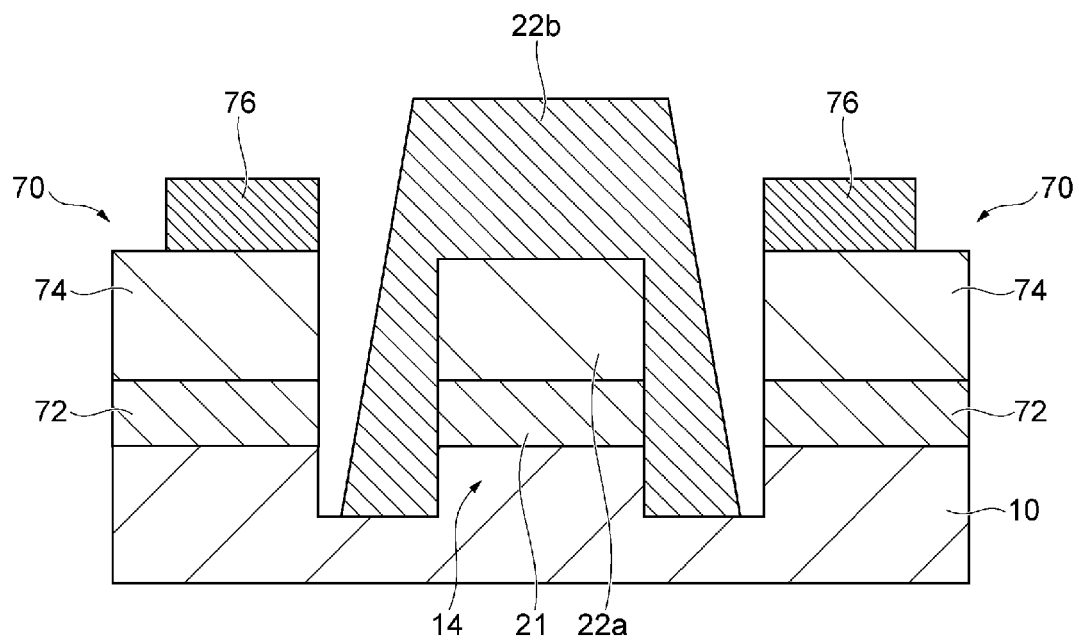
FIG. 10 is a cross-sectional view taken along line X-X of FIG. 8.

Next, as shown in FIG. 8, embedded region 38 and second semiconductor layer 22b are grown. FIG. 9 is a cross-sectional view taken along line IX-IX of FIG. 8. As shown in FIG. 9, embedded region 38 covers the side surfaces of first conductivity-type III-V compound semiconductor layer 14, light absorbing layer 32, and second III-V compound semiconductor layer 34. Thus, optical detector 30 is formed. FIG. 10 is a cross-sectional view taken along line X-X of FIG. 8. As shown in FIG. 10, second semiconductor layer 22b covers a top surface of first semiconductor layer 22a and side surfaces of first semiconductor layer 22a, core layer 21 and first conductivity-type III-V compound semiconductor layer 14. A thickness of second semiconductor layer 22b gradually decreases from core layer 21 toward light absorbing layer 32 along the optical axis direction of core layer 21. Thus, spot-size converter 20 is formed.

Figure 11:
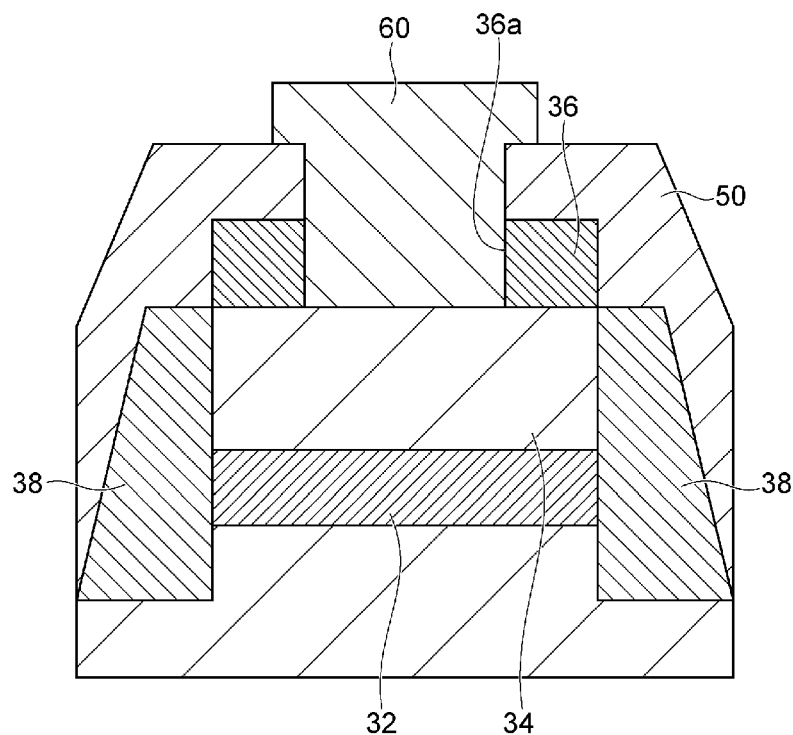
FIG. 11 is a cross-sectional view showing one step of a method of manufacturing a semiconductor optical device according to one embodiment.
Figure 12:
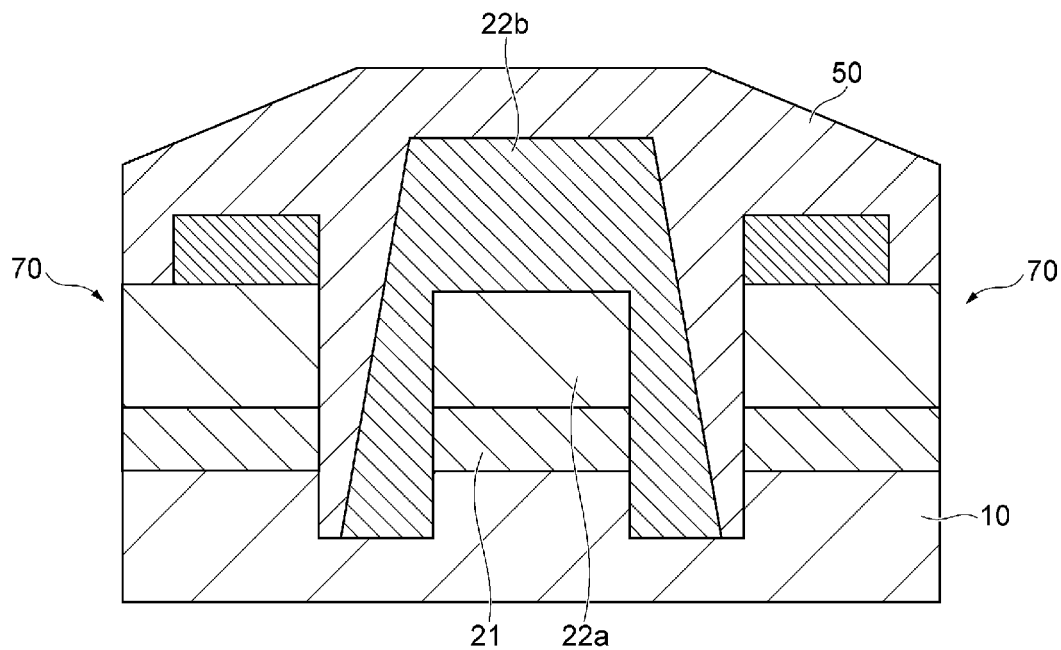
FIG. 12 is a cross-sectional view showing one step of a method of manufacturing a semiconductor optical device according to one embodiment.

Next, protective film 50 is formed on insulating film 36 and embedded region 38. Protective film 50 is also formed on second semiconductor layer 22b and semiconductor terrace 70 as shown in FIG. 12. Thereafter, an opening is formed in protective film 50 on second III-V compound semiconductor layer 34 by photolithography and etching, and then opening 36a is formed in insulating film 36. Thereafter, as shown in FIG. 11, electrodes 60 are formed in the openings of protective film 50 and opening 36a of insulating film 36 by lift-off.

Figure 13:
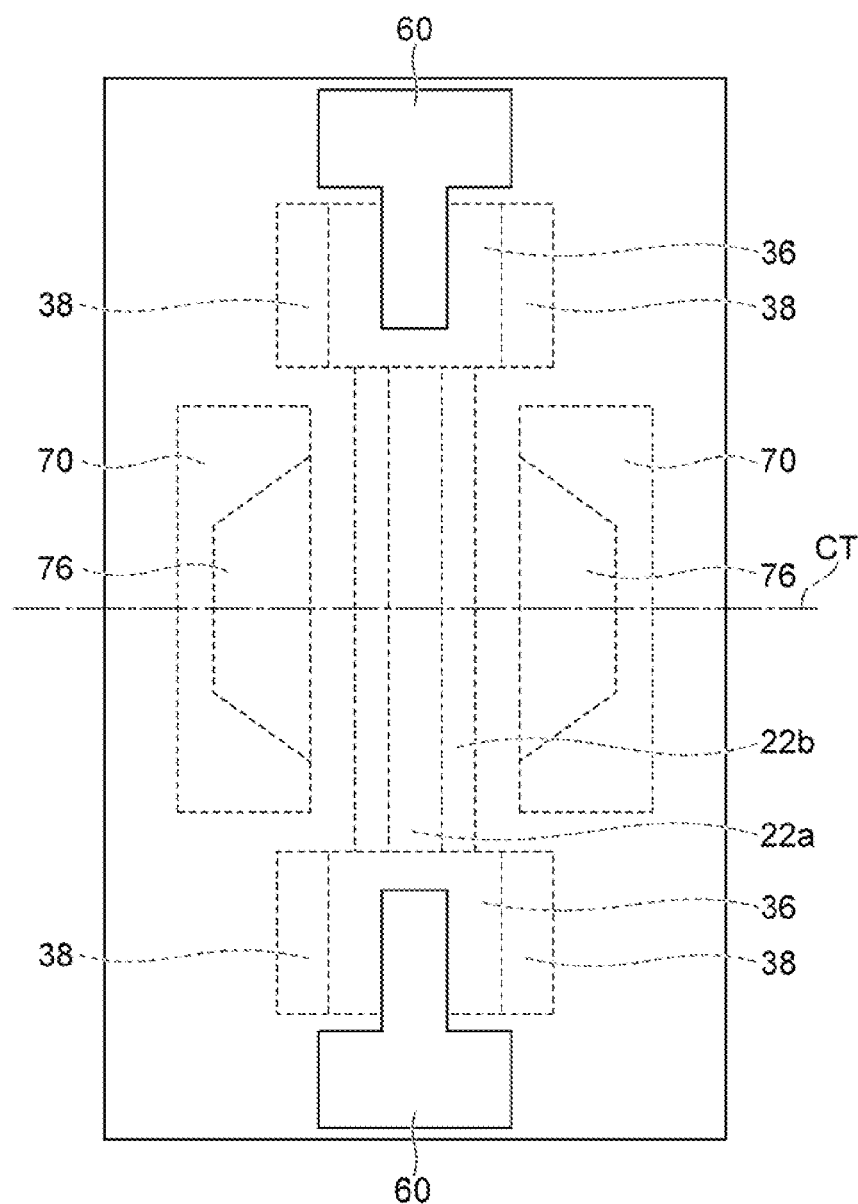
FIG. 13 is a plan view showing one step of a method of manufacturing a semiconductor optical device according to one embodiment.

Next, substrate 10, spot-size converter 20, semiconductor terraces 70 and protective film 50 are cut along a cutting-plane line CT shown in FIG. 13. The cutting may be cleavage. Thus, second end face E2 of spot-size converter 20 is formed.

Next, as shown in FIGS. 1 and 2, antireflection film 40 is formed at second end face E2.

Although embodiments of the present disclosure have been described in detail above, the present disclosure is not limited to the embodiments described above.

It should be understood that the embodiments disclosed herein are illustrative in all respects and are not restrictive. The scope of the present invention is defined by the appended claims rather than by the foregoing description, and is intended to include all modifications within the scope and meaning equivalent to the appended claims.

What is claimed is:

1. A semiconductor optical device comprising:
   a substrate having a main surface including a first region and a second region adjacent to the first region;
   a spot-size converter disposed in the first region; and
   an optical detector disposed in the second region,
   wherein the spot-size converter includes a core layer and a first III-V compound semiconductor layer,
   wherein the core layer is disposed between the substrate and the first III-V compound semiconductor layer,
   wherein the optical detector includes a light absorbing layer, a second III-V compound semiconductor layer, and an insulating film,
   wherein the light absorbing layer is disposed between the substrate and the second III-V compound semiconductor layer,
   wherein the second III-V compound semiconductor layer is disposed between the light absorbing layer and the insulating film,
   wherein the light absorbing layer is optically coupled to the core layer, wherein the spot-size converter has a first end face connected to the optical detector and a second end face opposite to the first end face, wherein the first III-V compound semiconductor layer is connected to the second III-V compound semiconductor layer and the insulating film at the first end face, wherein the first III-V compound semiconductor layer has a top surface and a side surface, wherein the core layer has a top surface and a side surface, wherein the first III-V compound semiconductor layer covers the top surface and the side surface of the core layer, and wherein $0.9 \leq XD/YD \leq 1.1$ is satisfied, where YD represents a distance between the top surface of the core layer and the top surface of the first III-V compound semiconductor layer in a first direction orthogonal to the main surface, and XD represents a distance between the side surface of the core layer and the side surface of the first III-V compound semiconductor layer in a second direction orthogonal to the first direction.

2. The semiconductor optical device according to claim 1, wherein $0.9 \leq XC/YC \leq 1.1$ is satisfied, where XC represents a length of the top surface of the core layer and YC represents a length of the side surface of the core layer.

3. The semiconductor optical device according to claim 1, wherein the optical detector has a third end face connected to the first end face, and wherein a distance from the main surface to a top surface of the insulating film at the third end face is larger than or equal to a distance from the main surface to the top surface of the first III-V compound semiconductor layer at the first end face.

4. The semiconductor optical device according to claim 1, further comprising:

an electrode, wherein the insulating film has an opening, and wherein the electrode is connected to the second III-V compound semiconductor layer through the opening.

5. The semiconductor optical device according to claim 1, wherein the insulating film contains titanium oxide.

6. A semiconductor optical device comprising:

a substrate having a main surface including a first region and a second region adjacent to the first region;

a spot-size converter disposed in the first region; and an optical detector disposed in the second region, wherein the spot-size converter includes a core layer and a first III-V compound semiconductor layer, wherein the core layer is disposed between the substrate and the first III-V compound semiconductor layer, wherein the optical detector includes a light absorbing layer, a second III-V compound semiconductor layer, and an insulating film, wherein the light absorbing layer is disposed between the substrate and the second III-V compound semiconductor layer, wherein the second III-V compound semiconductor layer is disposed between the light absorbing layer and the insulating film, wherein the light absorbing layer is optically coupled to the core layer, wherein the spot-size converter has a first end face connected to the optical detector and a second end face opposite to the first end face, wherein the first III-V compound semiconductor layer is connected to the second III-V compound semiconductor layer and the insulating film at the first end face, wherein the core layer has a top surface and a side surface, and wherein $0.9 \leq XC/YC \leq 1.1$ is satisfied, where XC represents a length of the top surface of the core layer and YC represents a length of the side surface of the core layer.

7. The semiconductor optical device according to claim 6, wherein the first III-V compound semiconductor layer has a top surface and a side surface, wherein the first III-V compound semiconductor layer covers the top surface and the side surface of the core layer, and wherein $0.9 \leq XD/YD \leq 1.1$ is satisfied, where YD represents a distance between the top surface of the core layer and the top surface of the first III-V compound semiconductor layer in a first direction orthogonal to the main surface, and XD represents a distance between the side surface of the core layer and the side surface of the first III-V compound semiconductor layer in a second direction orthogonal to the first direction.

8. The semiconductor optical device according to claim 6, wherein the optical detector has a third end face connected to the first end face, and wherein a distance from the main surface to a top surface of the insulating film at the third end face is larger than or equal to a distance from the main surface to a top surface of the first III-V compound semiconductor layer at the first end face.

9. The semiconductor optical device according to claim 6, further comprising:

an electrode, wherein the insulating film has an opening, and wherein the electrode is connected to the second III-V compound semiconductor layer through the opening.

10. The semiconductor optical device according to claim 6, wherein the insulating film contains titanium oxide.

* * * * *